(12) United States Patent
Su et al.

(10) Patent No.: US 12,439,747 B2
(45) Date of Patent: Oct. 7, 2025

(54) MICRO DEVICE AND DISPLAY APPARATUS

(71) Applicant: PlayNitride Display Co., Ltd., MiaoLi County (TW)

(72) Inventors: Yi-Min Su, MiaoLi County (TW); Sheng-Chieh Liang, MiaoLi County (TW); Chih-Ling Wu, MiaoLi County (TW); Gwo-Jiun Sheu, MiaoLi County (TW); Yu-Yun Lo, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 840 days.

(21) Appl. No.: 17/489,789

(22) Filed: Sep. 30, 2021

(65) Prior Publication Data

US 2022/0020903 A1   Jan. 20, 2022

Related U.S. Application Data

(63) Continuation-in-part of application No. 16/522,686, filed on Jul. 26, 2019, now Pat. No. 11,171,271.

(30) Foreign Application Priority Data

Apr. 24, 2019  (TW) ................. 108114271

(51) Int. Cl.
  *H10H 20/855* (2025.01)
  *H01L 25/075* (2006.01)
  *H10H 20/84* (2025.01)

(52) U.S. Cl.
  CPC ....... *H10H 20/855* (2025.01); *H01L 25/0753* (2013.01); *H10H 20/84* (2025.01)

(58) Field of Classification Search
  CPC .... H10H 20/855; H10H 20/84; H10H 20/854; H10H 20/853; H01L 25/0753
  See application file for complete search history.

(56) References Cited

U.S. PATENT DOCUMENTS

| | | | |
|---|---|---|---|
| 10,707,378 B2* | 7/2020 | Tomizawa | ........... H10H 20/832 |
| 2013/0015483 A1* | 1/2013 | Shimokawa | ........... H01L 24/96 |
| | | | 257/E33.072 |
| 2015/0263244 A1* | 9/2015 | Shimojuku | .......... H10H 20/812 |
| | | | 257/98 |

(Continued)

*Primary Examiner* — Su C Kim
(74) *Attorney, Agent, or Firm* — JCIPRNET (57) ABSTRACT

A micro device includes an epitaxial structure, an overcoat layer, and a first light-guiding structure. The epitaxial structure has a top surface and a bottom surface opposite to each other and a peripheral surface connecting the top surface and the bottom surface. The insulating layer covers at least the bottom surface and part of the peripheral surface of the epitaxial structure. The overcoat layer includes a contact portion and an extension portion. The contact portion conformally covers the insulating layer and the peripheral surface and the bottom surface of the epitaxial structure, and the extension portion connects the contact portion and extends in a direction away from the peripheral surface. The display apparatus includes a circuit substrate and a plurality of the above-mentioned micro devices. The micro devices are disposed and are correspondingly electrically connected to the first pads and the second pads of circuit substrate.

13 Claims, 7 Drawing Sheets

(56) References Cited

U.S. PATENT DOCUMENTS

2016/0043276 A1\* 2/2016 Im ............................ H01L 33/54
                                                                                    257/13
2016/0268471 A1\* 9/2016 Endo .................... H10H 20/833
2019/0097085 A1\* 3/2019 Tomizawa ........... H10H 20/835

\* cited by examiner

MICRO DEVICE AND DISPLAY APPARATUS

CROSS-REFERENCE TO RELATED APPLICATION

This application is a continuation-in-part application of and claims the priority benefit of U.S. application Ser. No. 16/522,686, filed on Jul. 26, 2019, now allowed. The prior U.S. application Ser. No. 16/522,686 claims the priority benefit of Taiwan patent application serial no. 108114271, filed on Apr. 24, 2019. The entirety of each of the above-mentioned patent applications is hereby incorporated by reference herein and made a part of specification.

BACKGROUND

Field of the Disclosure

This disclosure relates to a semiconductor structure, and more particularly to a micro device and a display apparatus.

Description of Related Art

At present, the transfer of the micro LEDs is to transfer the micro LEDs on a temporary substrate to a receiving substrate mainly through electrostatic force or magnetic force. In general, the micro LEDs are held through a holding structure, such that the micro LEDs are easily picked up from the temporary substrate, transported and transferred to the receiving substrate. Meanwhile, the holding structure is used to secure the micro LEDs so the quality of the micro LEDs is not affected due to other external factors during the transfer. However, since the area of the contact surface between the holding structure and the peripheral surface of the micro LED cannot be controlled easily, there is residual holding structure remained on the peripheral surface of the micro LED after the transfer, which affects light emission of the transferred micro LED. In view of the above, it has been one of the important issues in the industry to find out how to prevent the holding structure from remaining on the peripheral surface of the micro LED when transporting and transferring the micro LED.

SUMMARY

The disclosure provides a structure with micro device, which can make the break point in the subsequent transfer be located in the predetermined fracture region defined by the sacrificial portion of the holding structure and the extension portion of the overcoat layer, thereby preventing the sacrificial portion of the holding structure from remaining on the peripheral surface of the micro device after the transfer.

The disclosure provides a micro device having a better light-emitting effect.

The disclosure provides a display apparatus having a better reliability and a better light-emitting effect.

The micro device of the present disclosure includes an epitaxial structure, an overcoat layer, and a first light-guiding structure. The epitaxial structure has a top surface and a bottom surface opposite to each other and a peripheral surface connecting the top surface and the bottom surface. The insulating layer covers at least the bottom surface and part of the peripheral surface of the epitaxial structure. The overcoat layer includes a contact portion and an extension portion. The contact portion conformally covers the insulating layer and the peripheral surface and the bottom surface of the epitaxial structure, and the extension portion connects the contact portion and extends in a direction away from the peripheral surface.

In an embodiment of the disclosure, there is an included angle A' between the extension portion and the contact portion, and the included angle A' is between 90 degrees and 150 degrees.

In an embodiment of the disclosure, the epitaxial structure includes a first type semiconductor layer, a light emitting layer, and a second type semiconductor layer. The light emitting layer is disposed between the first type semiconductor layer and the second type semiconductor layer. The first type semiconductor layer has the top surface. The insulating layer covers the second type semiconductor layer, the light emitting layer and part of the first type semiconductor layer.

In an embodiment of the disclosure, the micro device further includes a first light-guiding structure. The first light-guiding structure is disposed on the top surface of the epitaxial structure and the extension portion of the overcoat layer. The orthogonal projection area of the first light-guiding structure on the horizontal plane is greater than or equal to the orthogonal projection area of the overcoat layer on the horizontal plane.

In an embodiment of the disclosure, the insulating layer is transparent and the overcoat layer is a reflective layer.

In an embodiment of the disclosure, the micro device further includes a second light-guiding structure. The second light-guiding structure is disposed on the first light-guiding structure, and the first light-guiding structure is disposed between the epitaxial structure and the second light-guiding structure. The first surface area of the first light-guiding structure is greater than the second surface area of the second light-guiding structure.

In an embodiment of the disclosure, the first light-guiding structure has a first thickness, and the second light-guiding structure has a second thickness, and the second thickness is greater than the first thickness.

In an embodiment of the disclosure, a thickness of a middle of the second light-guiding structure is greater than a thickness of an edge of the second light-guiding structure.

In an embodiment of the disclosure, the epitaxial structure includes a first type semiconductor layer, a light emitting layer, and a second type semiconductor layer. The light emitting layer is disposed between the first type semiconductor layer and the second type semiconductor layer. The first type semiconductor layer has a top surface. The area of the first light-guiding structure is larger than the area of the top surface, and the ratio of the area of the top surface to the area of the first light-guiding structure is larger than or equal to 0.5 and smaller than or equal to 0.95.

In an embodiment of the disclosure, the roughness of the first contact surface of the first light-guiding structure and the first type semiconductor layer is greater than the roughness of the second contact surface of the first light-guiding structure and the second light guiding structure.

In an embodiment of the disclosure, the roughness of the first contact surface of the first light-guiding structure and the first type semiconductor layer is greater than the roughness of the third contact surface of the first light-guiding structure and the extension portion of the overcoat layer.

In an embodiment of the disclosure, there is a minimum horizontal distance between the overcoat layer and the peripheral surface of the epitaxial structure, and the minimum horizontal distance is greater than or equal to 1 micrometer.

In an embodiment of the disclosure, the ratio of the orthogonal projection area of the overcoat layer on the horizontal plane to the orthogonal projection area of the first light-guiding structure on the horizontal plane is larger than or equal to 0.8 and smaller than or equal to 1.

In an embodiment of the disclosure, the ratio of the orthogonal projection area of the epitaxial structure on the horizontal plane to the orthogonal projection area of the overcoat layer on the horizontal plane is larger than or equal to 0.5 and smaller than or equal to 0.95.

In an embodiment of the disclosure, a surface of the extension portion of the overcoat layer is aligned with the top surface of the epitaxial structure.

The display apparatus of the present disclosure includes a circuit substrate and a plurality of micro devices. The circuit substrate includes a plurality of first pads and a plurality of second pads disposed on the circuit substrate. The plurality of devices are disposed on the circuit substrate and are correspondingly electrically connected to the first pads and the second pads. Each of the plurality of micro devices includes an epitaxial structure, an overcoat layer, and a first light-guiding structure. The epitaxial structure has a top surface and a bottom surface opposite to each other and a peripheral surface connecting the top surface and the bottom surface. The insulating layer covers at least the bottom surface and part of the peripheral surface of the epitaxial structure. The overcoat layer includes a contact portion and an extension portion. The contact portion conformally covers the insulating layer and the peripheral surface and the bottom surface of the epitaxial structure, and the extension portion connects the contact portion and extends in a direction away from the peripheral surface.

Based on the above, in the structure with micro device of the present disclosure, the overcoat layer of the structure with micro device has the extension portion contacting the sacrificial portion of the holding structure, wherein the extension portion extends in the direction away from the peripheral surface of the micro device, and a portion of the sacrificial portion contacts the extension portion to define the predetermined fracture region. Therefore, when the structure with micro device is transferred subsequently, the break point of the holding structure will be located in the predetermined fracture region, thereby preventing the sacrificial portion of the holding structure from remaining on the peripheral surface of the transferred micro device. In this manner, the light-emitting efficiency of the micro device of the present disclosure can be improved.

In order to make the aforementioned features and advantages of the disclosure more comprehensible, embodiments accompanying figures are described in detail below.

DESCRIPTION OF EMBODIMENTS

Embodiments of the present disclosure describe the structure of a micro device (e.g., a micro light-emitting diode (Micro LED)) that is ready to be picked up and transferred to a receiving substrate. The receiving substrate may be, for example, a display substrate, a light emitting substrate, a substrate having functional elements such as transistors or integrated circuits (ICs), or other substrates having circuits, but the disclosure is not limited thereto. Although some embodiments of the present disclosure specifically describe a micro LED including a p-n diode, it should be understood that embodiments of the present disclosure are not limited thereto, and certain embodiments may be applied to other micro devices. The micro devices are designed in this manner to control the execution of predetermined electronic functions (e.g., diodes, transistors, integrated circuits) or photonic functions (LEDs, lasers).

Figure 1A:
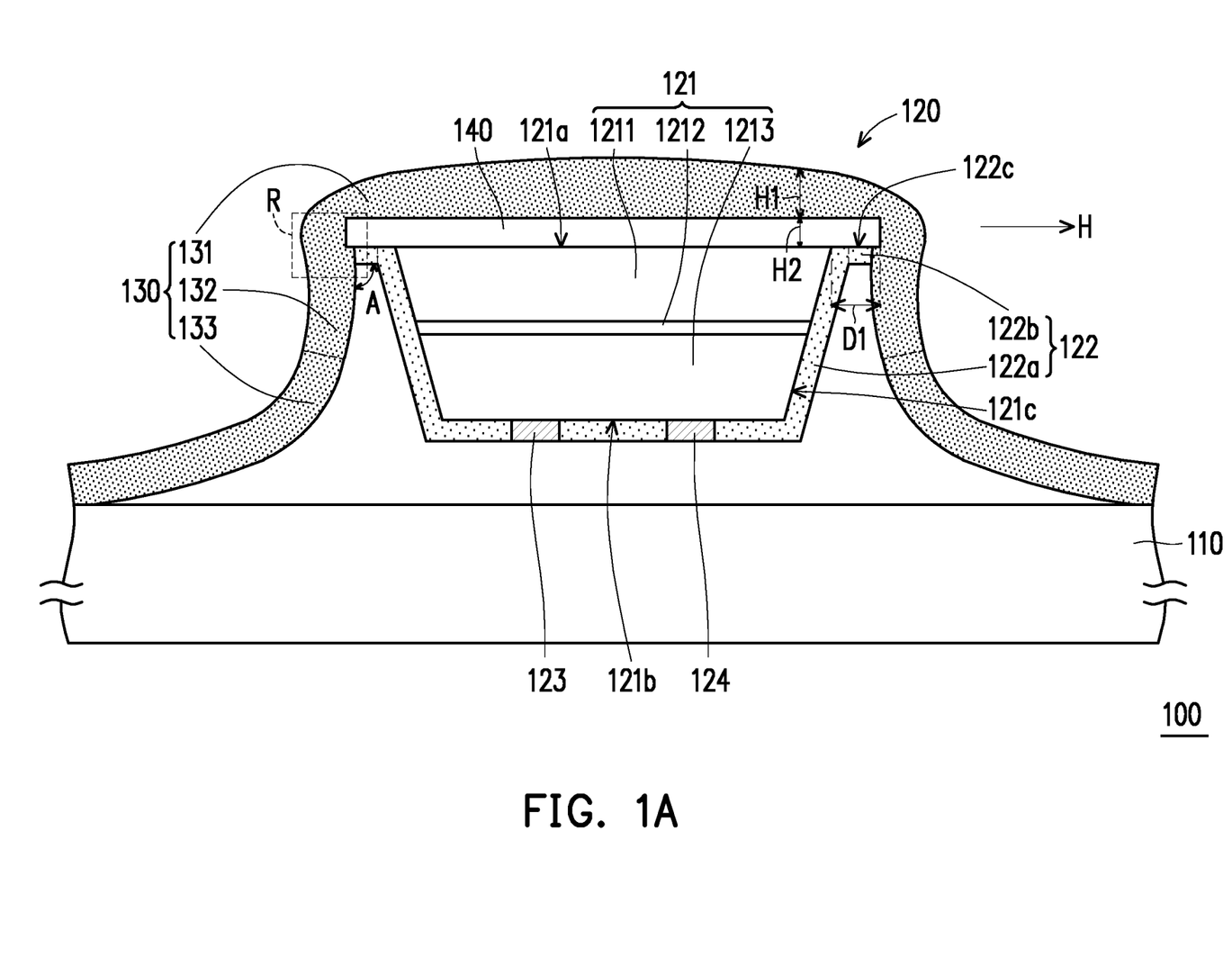
FIG. 1A is a schematic cross-sectional view showing a structure with micro device according to an embodiment of the disclosure.

FIG. 1A is a schematic cross-sectional view showing a structure with micro device according to an embodiment of the disclosure. Referring to FIG. 1A, a structure with micro device 100 of the present embodiment includes a substrate 110, at least one micro device 120 (one is schematically shown in FIG. 1A) and at least one holding structure 130 (one is schematically shown in FIG. 1A). The micro device 120 is disposed on the substrate 110. The micro device 120 includes an epitaxial structure 121 and an overcoat layer 122, wherein the epitaxial structure 121 has a top surface 121a and a bottom surface 121b opposite to each other and a peripheral surface 121c connecting the top surface 121a and the bottom surface 121b. The overcoat layer 122 includes a contact portion 122a and an extension portion 122b. The contact portion 122a covers the peripheral surface 121c and the bottom surface 121b of the epitaxial structure 121, and the extension portion 122b connects the contact portion 122a and extends in a horizontal direction H away from the peripheral surface 121c. The holding structure 130 is disposed on the substrate 110. The holding structure 130 includes at least one connecting portion 131 (one is schematically shown in FIG. 1A), at least one sacrificial portion 132 (one is schematically shown in FIG. 1A), and at least one holding portion 133 (one is shown schematically in FIG. 1A). The connecting portion 131 is disposed on the top surface 121a of the epitaxial structure 121 and the overcoat layer 122, and the sacrificial portion 132 connects the connecting portion 131 and the holding portion 133. Specifically, a portion of the sacrificial portion 132 contacts the extension portion 122b to define a predetermined fracture region R. The holding portion 133 connects the sacrificial portion 132 and extends onto the substrate 110. Herein, the holding portion 133 can directly contact the substrate 110 for better grip, or can connect the substrate 110 through a buffer layer (not shown) for better buffering function.

Further, the substrate 110 of the present embodiment is, for example, a temporary substrate such as a plastic substrate, a glass substrate, or a sapphire substrate, but the disclosure is not limited thereto. The micro device 120 is, for example, a micro LED, wherein the micro device 120 has a maximum size of smaller than or equal to 100 micrometers and a thickness of smaller than or equal to 15 micrometers, and can be subsequently transferred and integrated as well as assembled into a heterogeneous integrated system, including a substrate of any size ranging from a micro display to a large-area display, but the disclosure is not limited thereto. In the present embodiment, the epitaxial structure 121 of the micro device 120 includes a first type semiconductor layer 1211, a light emitting layer 1212 and a second type semiconductor layer 1213. The light emitting layer 1212 is disposed between the first type semiconductor layer 1211 and the second type semiconductor layer 1213, and the first type semiconductor layer 1211 is disposed between the connecting portion 131 of the holding structure 130 and the light emitting layer 1212. The first type semiconductor layer 1211 has a top surface 121a, and the second type semiconductor layer 1213 has a bottom surface 121b. Furthermore, the micro device 120 of the embodiment further includes a first type electrode 123 and a second type electrode 124. The first type electrode 123 and the second type electrode 124 are disposed on the bottom surface 121b of the epitaxial structure 121, and the holding structure 130 is relatively far away from the first type electrode 123 and the second type electrode 124, so as to prevent the holding structure 130 from affecting the first type electrode 123 and the second type electrode 124. In other words, the micro device 120 of the embodiment is implemented as a flip-chip micro device, but the disclosure is not limited thereto.

Furthermore, the contact portion 122a of the overcoat layer 122 of the present embodiment covers the peripheral surface 121c and the bottom surface 121b of the epitaxial structure 121. Herein, the overcoat layer 122 may have a reflecting function to reflect the light emitted by the light emitting layer 1212 of the epitaxial structure 121 to improve the light-emitting efficiency. In an embodiment, the overcoat layer 122 may be, for example, a Distributed Bragg Reflector (DBR), but the disclosure is not limited thereto. The overcoat layer 122 may also have a protecting and insulating function. In an embodiment, the material of the overcoat layer 122 may be, for example, silica or silicon nitride, but the disclosure is not limited thereto. As shown in FIG. 1A, the extension portion 122b of the overcoat layer 122 of the present embodiment connects the contact portion 122a and extends in a horizontal direction H away from the peripheral surface 121c of the epitaxial structure 121. The holding structure 130 and the epitaxial structure 121 are separated by the design of the extension portion 122b of the overcoat layer 122, so that the sacrificial portion 132 and the holding portion 133 of the holding structure 130 do not contact the epitaxial structure 121 of the micro device 120.

More specifically, please refer to FIG. 1A. In this embodiment, there is an included angle A between the sacrificial portion 132 of the holding structure 130 and the extension portion 122b of the overcoat layer 122. Preferably, the included angle A is, for example, between 80 degrees and 120 degrees. When the included angle A is smaller than 80 degrees, the sacrificial portion 132 of the holding structure 130 may be too close to the contact portion 122a contacting the overcoat layer 122 to cause difficulty in subsequent transfer. When the included angle A is larger than 120 degrees, the sacrificial portion 132 of the holding structure 130 may be too far away from the contact portion 122a of the overcoat layer 122 and may cause insufficient support force. In an embodiment, the sacrificial portion 132 of the holding structure 130 may also be perpendicular to the extension portion 122b of the overcoat layer 122. In another embodiment, the extending direction of the sacrificial portion 132 of the holding structure 130 may also be perpendicular to the substrate 110, so that the holding structures 130 may be closely arranged on the substrate 110 to increase the arrangement density of the micro device 120. Herein, there is a minimum horizontal distance D1 between one end of the extension portion 122b of the overcoat layer 122 connected to the sacrificial portion 132 of the holding structure 130 and the peripheral surface 121c of the epitaxial structure 121. Preferably, the minimum horizontal distance D1 is, for example, larger than or equal to 1 micrometer, so that the sacrificial portion 132 of the holding structure 130 is not too close to the epitaxial structure 121, and the residual after the subsequent transfer can be avoided. Further, the surface 122c of the extension portion 122b of the overcoat layer 122 is aligned with the top surface 121a of the epitaxial structure 121. That is, the extending direction H of the extension portion 122b of the overcoat layer 122 is parallel and identical to the extending direction of the top surface 121a of the epitaxial structure 121.

Further referring to FIG. 1A, the orthogonal projection of the epitaxial structure 121 on the substrate 110 of the present embodiment completely overlaps the orthogonal projection of the overcoat layer 122 on the substrate 110. The orthogonal projection area of the epitaxial structure 121 on the substrate 110 is smaller than the orthogonal projection area of the overcoat layer 122 on the substrate 110. Preferably, the ratio of the orthogonal projection area of the epitaxial structure 121 on the substrate 110 to the orthogonal projection area of the overcoat layer 122 on the substrate 110 is larger than or equal to 0.5 and smaller than or equal to 0.95. With the orthogonal projection area of the overcoat layer 122 being larger than the orthogonal projection area of the epitaxial structure 121, the sacrificial portion 132 and the holding portion 133 of the holding structure 130 do not contact the epitaxial structure 121 of the micro device 120.

In order to further improve the light-emitting efficiency, the structure with micro device 100 of the present embodiment further includes at least one light-guiding structure 140 (one is schematically shown in FIG. 1A), wherein the light-guiding structure 140 is disposed on the micro device 120 and covers the top surface 121a of the epitaxial structure 121 and the extension portion 122b of the overcoat layer 122. More specifically, the light-guiding structure 140 is disposed between the connecting portion 131 of the holding structure 130 and the top surface 121a of the epitaxial structure 121, and between the connecting portion 131 of the holding structure 130 and the extension portion 122b of the overcoat layer 122. Herein, as shown in FIG. 1A, the light-guiding structure 140 directly contacts the connecting portion 131 of the holding structure 130, the top surface 121a of the epitaxial structure 121, and the extension portion 122b of the overcoat layer 122. Specifically, the thickness H1 of the holding structure 130 is larger than the thickness H2 of the light-guiding structure 140, and may have a better holding force. The ratio of the orthogonal projection area of the overcoat layer 122 on the substrate 110 to the orthogonal projection area of the light-guiding structure 140 on the substrate 110 is, for example, larger than or equal to 0.8 and smaller than or equal to 1. In other words, with the design of the extension portion 122b of the overcoat layer 122, for the light-guiding structure 140 that cannot be entirely disposed on the top surface of the epitaxial structure of the micro device because the micro device is too small, since the orthogonal projection area of the light-guiding structure 140 of the present disclosure on the substrate 110 is larger than the orthogonal projection area of the epitaxial structure 121 on the substrate 110, a better light-guiding effect can be achieved. Preferably, the ratio of the area of the top surface 121*a* of the epitaxial structure 121 to the area of the light-guiding structure 140 is, for example, larger than or equal to 0.5 and smaller than or equal to 0.95. When the ratio is smaller than 0.5, the space occupied by the light-guiding structure 140 is too large, which affects the subsequent transfer yield. When the ratio is larger than 0.95, the process margin of the light-guiding structure 140 disposed on the top surface 121*a* of the epitaxial structure 121 is too small, which easily causes deviation and the light-guiding structure 140 cannot be completely disposed.

In short, in the structure with micro device 100 of the present embodiment, only a portion of the sacrificial portion 132 of the holding structure 130 is in contact with the extension portion 122*b* of the overcoat layer 122 of the micro device 120. That is, the holding structure 130 does not contact the epitaxial structure 121 of the micro device 120. Thus, when the micro device 120 in the structure with micro device 100 is picked up from the substrate 110 and transported and transferred, the force of picking up the micro device 120 causes the holding structure 130 to be fractured from the predetermined fracture region R defined by the sacrificial portion 132 and the extension portion 122*b*, which makes the micro device 120 to be separated from the sacrificial portion 132 and the holding portion 133 of the holding structure 130. In this manner, it is possible to prevent the sacrificial portion 132 of the holding structure 130 from remaining on the peripheral surface 121*c* of the micro device 120 to affect the light emission and cause a defect at the time of transfer. In addition, the connecting portion 131 of the holding structure 130 remaining on the micro device 120 after picking up and transferring can be regarded as a light-guiding structure, which can improve the light-emitting efficiency of the micro device 120.

Figure 1B:
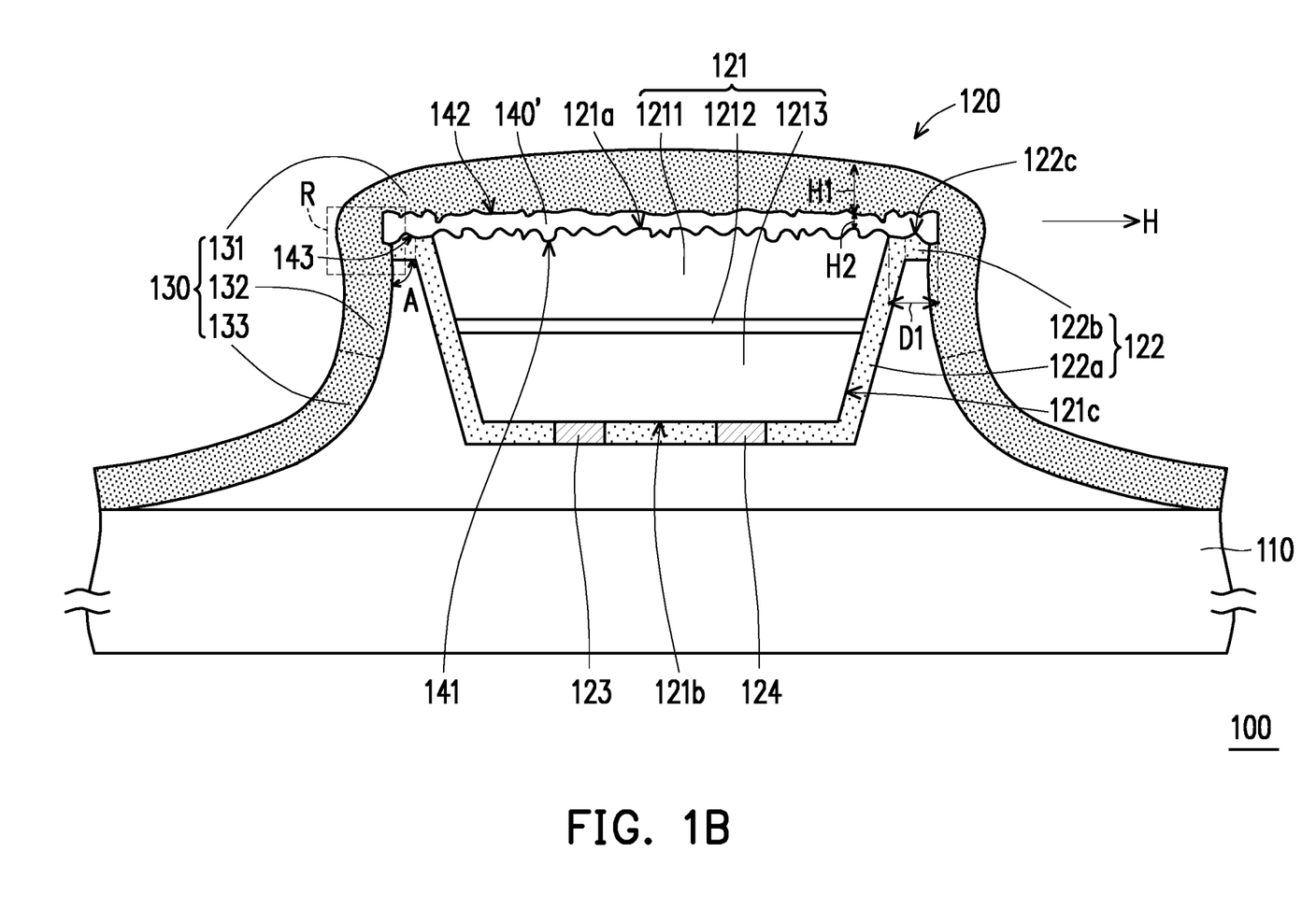
FIG. 1B is a schematic cross-sectional view showing a structure with micro device according to another embodiment of the present disclosure.

FIG. 1B is a schematic cross-sectional view showing a structure with micro device according to another embodiment of the present disclosure. Referring to FIG. 1A and FIG. 1B, the roughness of the contact surface 141 of the light-guiding structure 140' and the first type semiconductor layer 1211 of the present embodiment is greater than the roughness of the contact surface 142 of the light-guiding structure 140' and the holding structure 130. The roughness of the contact surface 141 of the light-guiding structure 140' and the first type semiconductor layer 1211 is also greater than the roughness of the contact surface 143 of the light-guiding structure 140' and the extension portion 122*b* of the overcoat layer 122. Herein, the roughness refers to arithmetical mean deviation (Ra). That is, the roughness of the light-guiding structure 140' in the central region (i.e., where the first type semiconductor layer 1211 is located) facing the side of the micro device 120 is greater than the roughness of the periphery region (i.e., where the extension portion 122*b* of the overcoat layer 122 is located) surrounding the central region, which can further improve the light-emitting efficiency, especially the light-emitting rate in the central region to increase forward light.

Figure 2A:
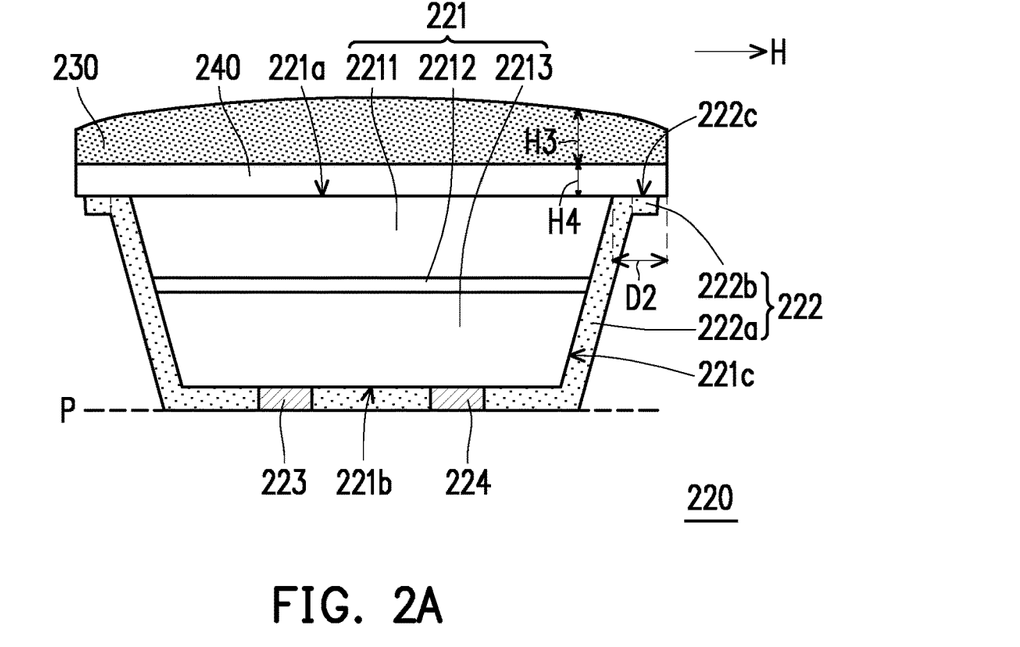
FIG. 2A is a schematic cross-sectional view of a micro device according to an embodiment of the disclosure.
Figure 2B:
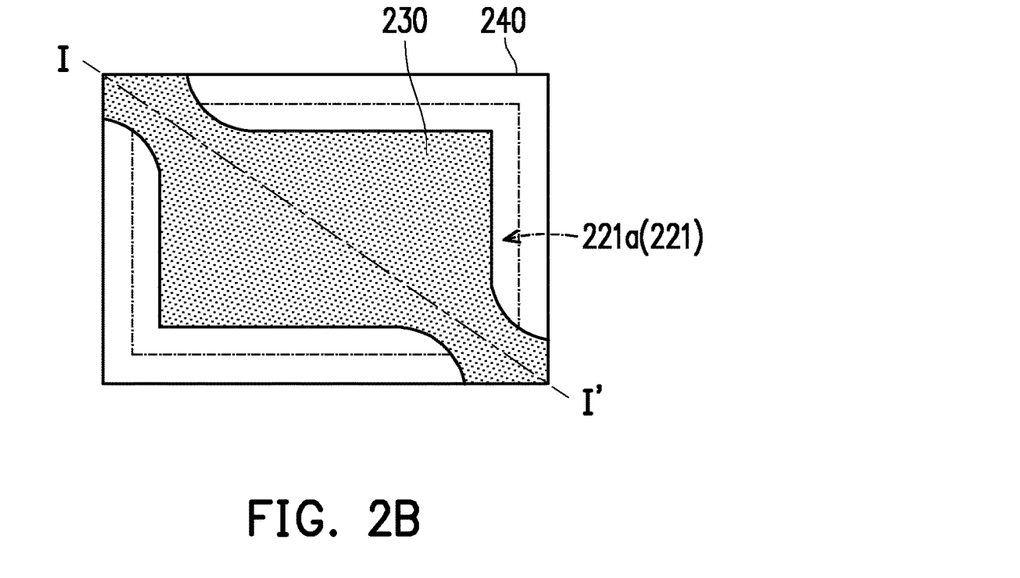
FIG. 2B is a schematic top view of the micro device of FIG. 2A.

FIG. 2A is a schematic cross-sectional view of a micro device according to an embodiment of the disclosure. FIG. 2B is a schematic top view of the micro device of FIG. 2A, wherein the micro device of FIG. 2B is depicted along line I-I' of FIG. 2A. Referring to FIG. 2A and FIG. 2B, a micro device 220 of the embodiment includes an epitaxial structure 221, an overcoat layer 222, a first light-guiding structure 240 and a second light-guiding structure 230. The epitaxial structure 221 has a top surface 221*a* and a bottom surface 221*b* opposed to each other and a peripheral surface 221*c* connecting the top surface 221*a* and the bottom surface 221*b*. The overcoat layer 222 includes a contact portion 222*a* and an extension portion 222*b*. The contact portion 222*a* covers the peripheral surface 221*c* and the bottom surface 221*b* of the epitaxial structure 221, and the extension portion 222*b* connects the contact portion 222*a* and extends in a horizontal direction H away from the peripheral surface 221*c*. The first light-guiding structure 240 is disposed on the top surface 221*a* of the epitaxial structure 221 and the extension portion 222*b* of the overcoat layer 222. The second light-guiding structure 230 is disposed on the first light-guiding structure 240, and the first light-guiding structure 240 is disposed between the epitaxial structure 221 and the second light-guiding structure 230. Preferably, the surface area of the first light-guiding structure 240 is larger than the surface area of the second light-guiding structure 230, and the orthogonal projection area of the first light-guiding structure 240 on a horizontal plane P is larger than the orthogonal projection area of the overcoat layer 222 on the horizontal plane P.

Specifically, in the present embodiment, the epitaxial structure 221 includes a first type semiconductor layer 2211, a light emitting layer 2212 and a second type semiconductor layer 2213. The light emitting layer 2212 is disposed between the first type semiconductor layer 2211 and the second type semiconductor layer 2213, and the first type semiconductor layer 2211 is disposed between the first light-guiding structure 240 and the light emitting layer 2212. The first type semiconductor layer 2211 has a top surface 221*a*, and the second type semiconductor layer 2213 has a bottom surface 221*b*. Furthermore, the micro device 220 of the embodiment further includes a first type electrode 223 and a second type electrode 224. The first type electrode 223 and the second type electrode 224 are disposed on the bottom surface 221*b* of the epitaxial structure 221, and the first light-guiding structure 240 and the second light-guiding structure 230 are relatively far away from the first type electrode 223 and the second type electrode 224, thereby avoiding affecting the first type electrode 223 and the second type electrode 224. In other words, the micro device 220 of the present embodiment is implemented as a flip-chip micro device, but the disclosure is not limited thereto.

Furthermore, the contact portion 222*a* of the overcoat layer 222 of the present embodiment covers the peripheral surface 221*c* and the bottom surface 221*b* of the epitaxial structure 221. Herein, the overcoat layer 222 may have a reflecting function to reflect the light emitted by the light emitting layer 2212 of the epitaxial structure 221 to improve the light-emitting efficiency. In an embodiment, the overcoat layer 222 can be, for example, a Distributed Bragg Reflector (DBR), but the disclosure is not limited thereto. The overcoat layer 222 may also have a protecting and insulating function. In another embodiment, the material of the overcoat layer 222 may be, for example, silica or silicon nitride, but the disclosure is not limited thereto. The extension portion 222*b* of the overcoat layer 222 connects the contact portion 222*a* and extends in a horizontal direction H away from the peripheral surface 221*c* of the epitaxial structure 221. Herein, there is a minimum horizontal distance D2 between one end of the extension portion 222*b* of the overcoat layer 222 relatively far away from the peripheral surface 221*c* of the epitaxial structure 221 and the peripheral surface 221*c*. Preferably, the minimum horizontal distance D2 is, for example, larger than or equal to 1 micrometer. In addition, the surface 222*c* of the extension portion 222*b* of the overcoat layer 222 is aligned with the top surface 221a of the epitaxial structure 221, that is, the extending direction H of the extension portion 222b of the overcoat layer 222 is parallel and identical to the extending direction of the top surface 221a of the epitaxial structure 221.

Referring to FIG. 2A and FIG. 2B, the orthogonal projection of the epitaxial structure 221 of the present embodiment on the horizontal plane P completely overlaps the orthogonal projection of the overcoat layer 222 on the horizontal plane P. That is, the orthogonal projection area of the epitaxial structure 221 on the horizontal plane P is smaller than the orthogonal projection area of the overcoat layer 222 on the horizontal plane P. Preferably, the ratio of the orthogonal projection area of the epitaxial structure 221 on the horizontal plane P to the orthogonal projection area of the overcoat layer 222 on the horizontal plane P is larger than or equal to 0.5 and smaller than or equal to 0.95. Moreover, the orthogonal projection area of the overcoat layer 222 on the horizontal plane P is smaller than or equal to the orthogonal projection area of the first light-guiding structure 240 on the horizontal plane P. Preferably, the ratio of the orthogonal projection area of the overcoat layer 222 on the horizontal plane P to the orthogonal projection area of the first light-guiding structure 240 on the horizontal plane P is, for example, larger than or equal to 0.8 and smaller than or equal to 1.

More specifically, the area of the first light-guiding structure 240 of the present embodiment is larger than the area of the top surface 221a, and the ratio of the area of the top surface 221a to the area of the first light-guiding structure 240 is, for example, larger than or equal to 0.5 and smaller than or equal to 0.95. When the ratio is smaller than 0.5, the space occupied by the first light-guiding structure 240 is too large, which affects the yield of subsequent transfer. When the ratio is larger than 0.95, the process margin of the first light-guiding structure 240 disposed on the top surface 221a is too small, which easily causes deviation and the first light-guiding structure 240 cannot be completely disposed. In other words, with the design of the extension portion 222b of the overcoat layer 222, for the light-guiding structure that cannot be entirely disposed on the micro device because the micro device is too small, since the orthogonal projection area of the first light-guiding structure 240 of the present disclosure on the horizontal plane P is larger than the orthogonal projection area of the epitaxial structure 221 on the horizontal plane P, a better light-guiding effect can be achieved. Furthermore, the thickness H3 of the second light-guiding structure 230 of the embodiment is larger than the thickness H4 of the first light-guiding structure 240, and the light emission can be increased by the difference in thickness. The area of the second light-guiding structure 230 is smaller than the area of the top surface 221a, wherein the ratio of the area of the second light-guiding structure 230 to the area of the top surface 221a is, for example, larger than or equal to 0.5 and smaller than or equal to 0.95. Furthermore, the second light-guiding structure 230 is disposed in the central region of the top surface 221a, and such design can improve forward light emission in the central region.

Figure 2C:
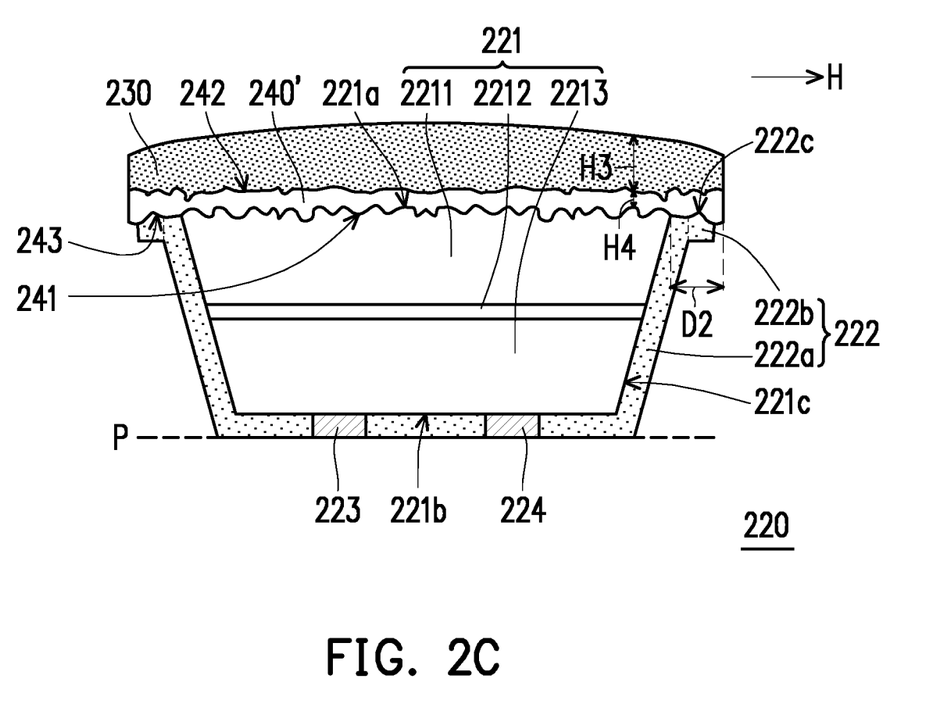
FIG. 2C is a schematic cross-sectional view showing a micro device according to another embodiment of the present disclosure.

In addition, in order to improve the light-guiding efficiency, as shown in FIG. 2C, the roughness of the contact surface 241 of the first light-guiding structure 240' and the first type semiconductor layer 2211 of the present embodiment is greater than the roughness of the contact surface 242 of the first light-guiding structure 240' and the second light-guiding structure 230. The roughness of the contact surface 241 of the first light-guiding structure 240' and the first type semiconductor layer 2211 is also greater than the roughness of the contact surface 243 of the first light-guiding structure 240' and the extension portion 222b of and the overcoat layer 222. Herein, the roughness refers to arithmetical mean deviation (Ra). That is, the roughness of the first light-guiding structure 240' in the central region (i.e., where the first type semiconductor layer 2211 is located) facing the side of the epitaxial structure 221 is greater than the roughness of the periphery region (i.e., where the extension portion 222b of the overcoat layer 222 is located) surrounding the central region, which can further improve the light-emitting efficiency, especially the light-emitting rate in the central region to increase forward light.

It should be noted that, in the micro device 220 of the present embodiment, the arrangement position of the second light-guiding structure 230 is similar to the connecting portion 131 of the holding structure 130 of the structure with micro device 100 in FIG. 1A. When transferring the micro device 120 in the structure with micro device 100 of FIG. 1A, the break point of the holding structure 130 will fall within the predetermined fracture region R, and the connecting portion 131 of the holding structure 130 remaining on the picked-up, transferred micro device 120 can be regarded as the second light-guiding structure 230 in the micro device 220 of FIG. 2A, which can be used to enhance the light-emitting efficiency of the micro device 220.

It is to be noted that the following embodiments use the same reference numerals and parts of the content in the above embodiments, and the same reference numerals are used to refer to the same or similar elements, and the description of the same technical content is omitted. For the description of the omitted portions, reference may be made to the foregoing embodiments, and repetition is not incorporated in the following embodiments.

Figure 3A:
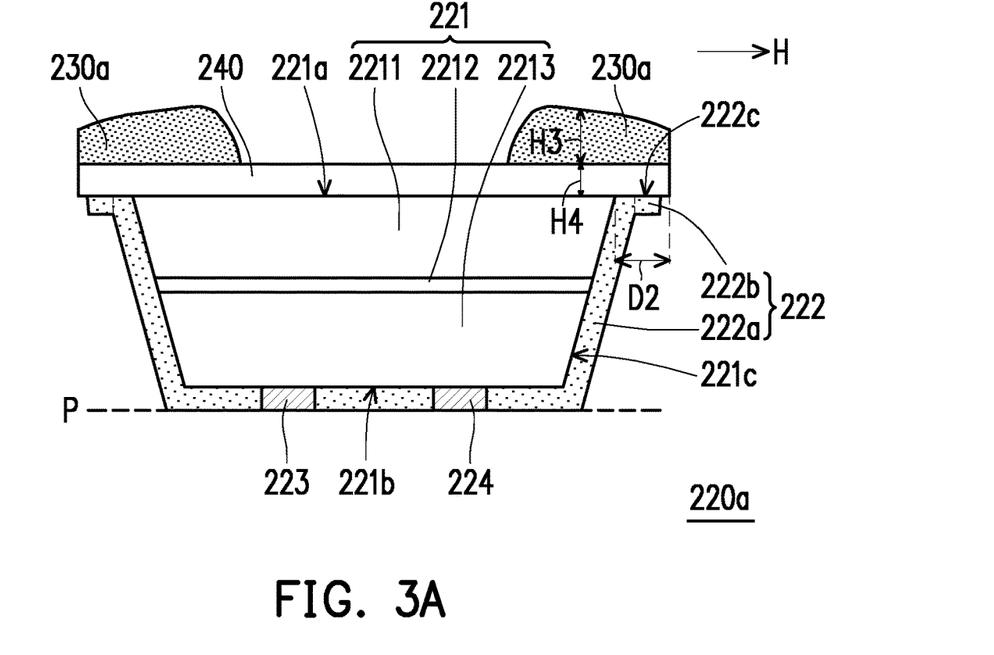
FIG. 3A is a schematic cross-sectional view showing a micro device according to another embodiment of the present disclosure.
Figure 3B:
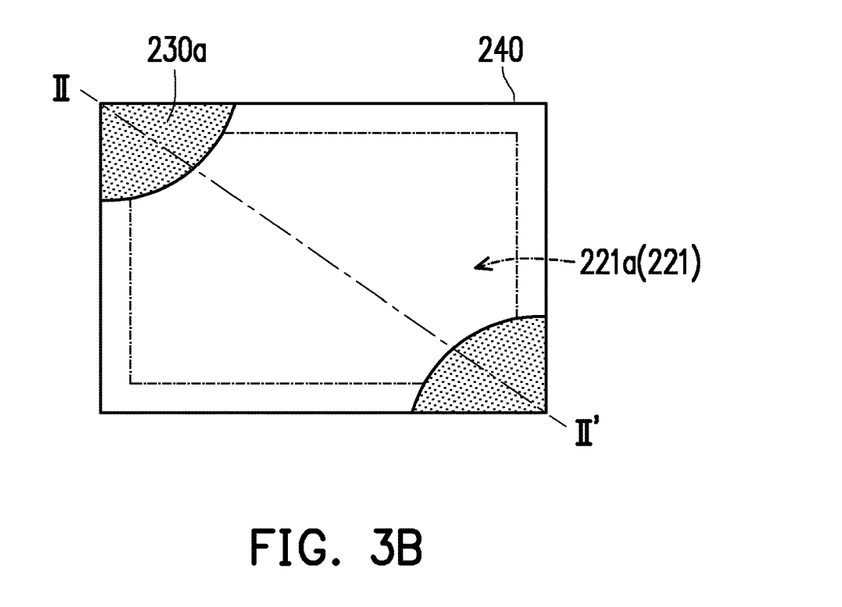
FIG. 3B is a schematic top view of the micro device of FIG. 3A.

FIG. 3A is a schematic cross-sectional view showing a micro device according to another embodiment of the present disclosure. FIG. 3B is a schematic top view of the micro device of FIG. 3A, wherein the micro device of FIG. 3B is depicted along line II-II' of FIG. 3A. Referring to FIG. 2A, FIG. 2B, FIG. 3A and FIG. 3B, the micro device 220a of the present embodiment is similar to the micro device 220 of FIG. 2A, and the difference between the two is that the second light-guiding structure 230a of the present embodiment is only disposed in a corner of one of diagonals on the first light-guiding structure 240'. That is, the second light-guiding structure 230a is mainly disposed in the peripheral region (that is, where the extension portion 222b of the overcoat layer 222 is located) and the partial central region (i.e., where the first type semiconductor layer 2211 is located), thereby controlling the process yield in the subsequent picking-up process.

Figure 4:
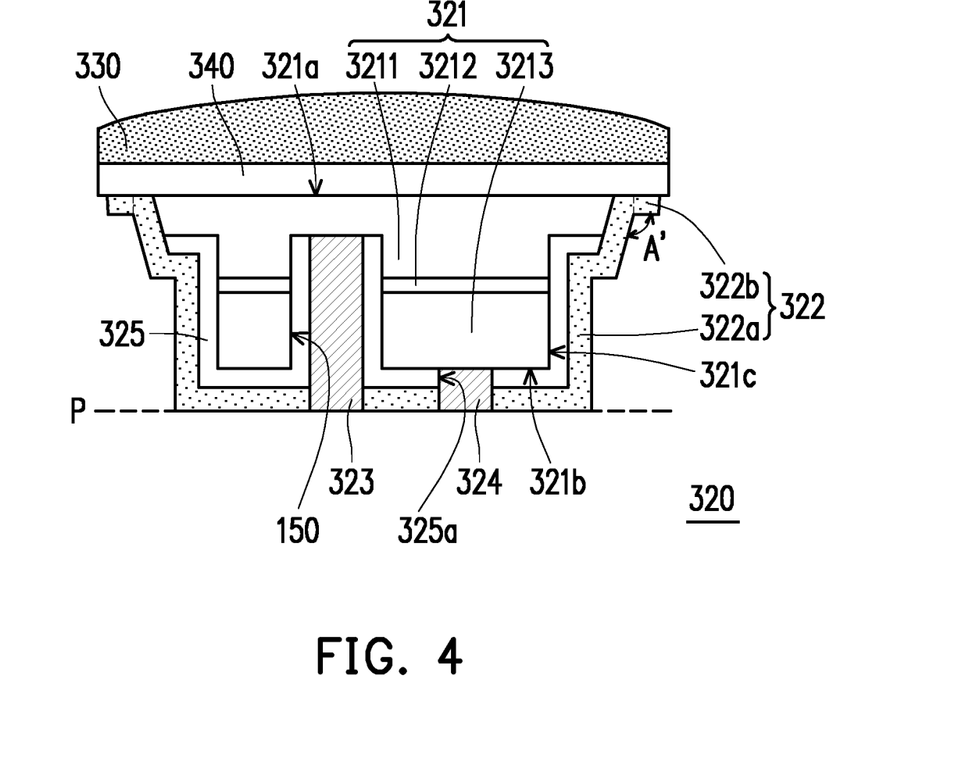
FIG. 4 is a schematic cross-sectional view showing a micro device according to another embodiment of the present disclosure.

FIG. 4 is a schematic cross-sectional view showing a micro device according to another embodiment of the present disclosure. Referring to FIG. 2A and FIG. 4, a micro device 320 of the present embodiment is similar to the micro device 220 of FIG. 2A, and the difference between the two is that the micro device 320 of the embodiment includes an insulating layer 325 and a via hole 150. The via hole 150 penetrates through the second type semiconductor layer 3213, the light emitting layer 3212 and exposes a portion of the first type semiconductor layer 3211.

Specifically, the insulating layer 325 covers at least the bottom surface 321b and part of the peripheral surface 321c of the epitaxial structure 321. In the embodiment, the insulating layer 325 covers the second type semiconductor layer 3213, the light emitting layer 3212 and part of the first type semiconductor layer 3211. The insulating layer 325 includes an opening 325a to expose a portion of the second type semiconductor layer 3213. Since the insulating layer 325 covers the light emitting layer 3212, the light emitting layer 3212 may be protected. Since the insulating layer 325 does not completely cover the peripheral surface 321c, the insulating layer 325 does not occupy a lower space of the first type semiconductor layer 3211 and can increase a utilization rate when a wafer is fabricated into a chip. In the present embodiment, the insulating layer 325 is transparent. The insulating layer 325 may have a protecting function and have better light-guide efficiency of a side light of the micro device 320. The material of the insulating layer 325 may be, for example, silicon oxide or other oxide layers with the protecting function, but the disclosure is not limited thereto.

The contact portion 322a of the overcoat layer 322 conformally covers the insulating layer 325 and the peripheral surface 321c and the bottom surface 321b of the epitaxial structure 321, and the extension portion 322b connects the contact portion 322a and extends in a direction away from the peripheral surface 321c. Thereby, the extension portion 322b and the contact portion 322a of the overcoat layer 322 may have the same thickness, so as to increase a yield of the chip and reduce a space occupied by the chip. In the present embodiment, the overcoat layer 322 may be a reflective layer such as DBR or a metal layer with a highly reflectivity greater than 90%, so that the side light may of the micro device 320 be reflected and a forward light may be increased.

In the present embodiment, there is an included angle A' between the extension portion 322b and the contact portion 322a, and the included angle A' is between 90 degrees and 150 degrees. When the included angle A' is smaller than 90 degrees, the extension portion 322b may be too close to the contact portion 322a contacting the overcoat layer 322 to be easily crushed, thereby causing difficulty in subsequent transfer of the micro device 320. When the included angle A' is larger than 150 degrees, the extension portion 322b may excessively occupy too much space.

In the present embodiment, an orthogonal projection area of the first light-guiding structure 340 on the horizontal plane P is greater than or equal to an orthogonal projection area of the overcoat layer 322 on the horizontal plane P.

In the present embodiment, an orthogonal projection area of the second light-guiding structure 330 on the top surface 321a of the epitaxial structure 321 is larger than an orthogonal projection area of the second light-guiding structure 330 on the extension portion 322b. In other words, an area of the second light-guiding structure 330 disposed on the top surface 321a is greater than an area of the second light-guiding structure 330 disposed on the extension portion 322b. That is, the area of the second light-guiding structure 330 in the central region (i.e., where the first type semiconductor layer 3211 is located) is greater than an area of the second light-guiding structure 330 in the periphery region (i.e., where the extension portion 322b of the overcoat layer 322 is located), so as to increase a light-emitting rate in the central region and increase forward light. In addition, in the present embodiment, a thickness of a middle of the second light-guiding structure 330 is greater than a thickness of an edge of the second light-guiding structure 330 to increase forward light.

In the present embodiment, the micro device 320 further includes a first type electrode 323 and a second type electrode 324. The first type electrode 323 and the second type electrode 324 are disposed on the bottom surface 321b of the epitaxial structure 321. The first type electrode 323 is disposed within the via hole 150 to electrically connect to the first type semiconductor layer 3211. The second type electrode 324 is disposed in the opening 325a and electrically connected to the second type semiconductor layer 3213. In addition, a portion of the insulating layer 325 is located between a side wall of the via hole 150 and the first type electrode 323 to electrically insulate the second type semiconductor layer 3213 and the first type electrode 323.

Figure 5:
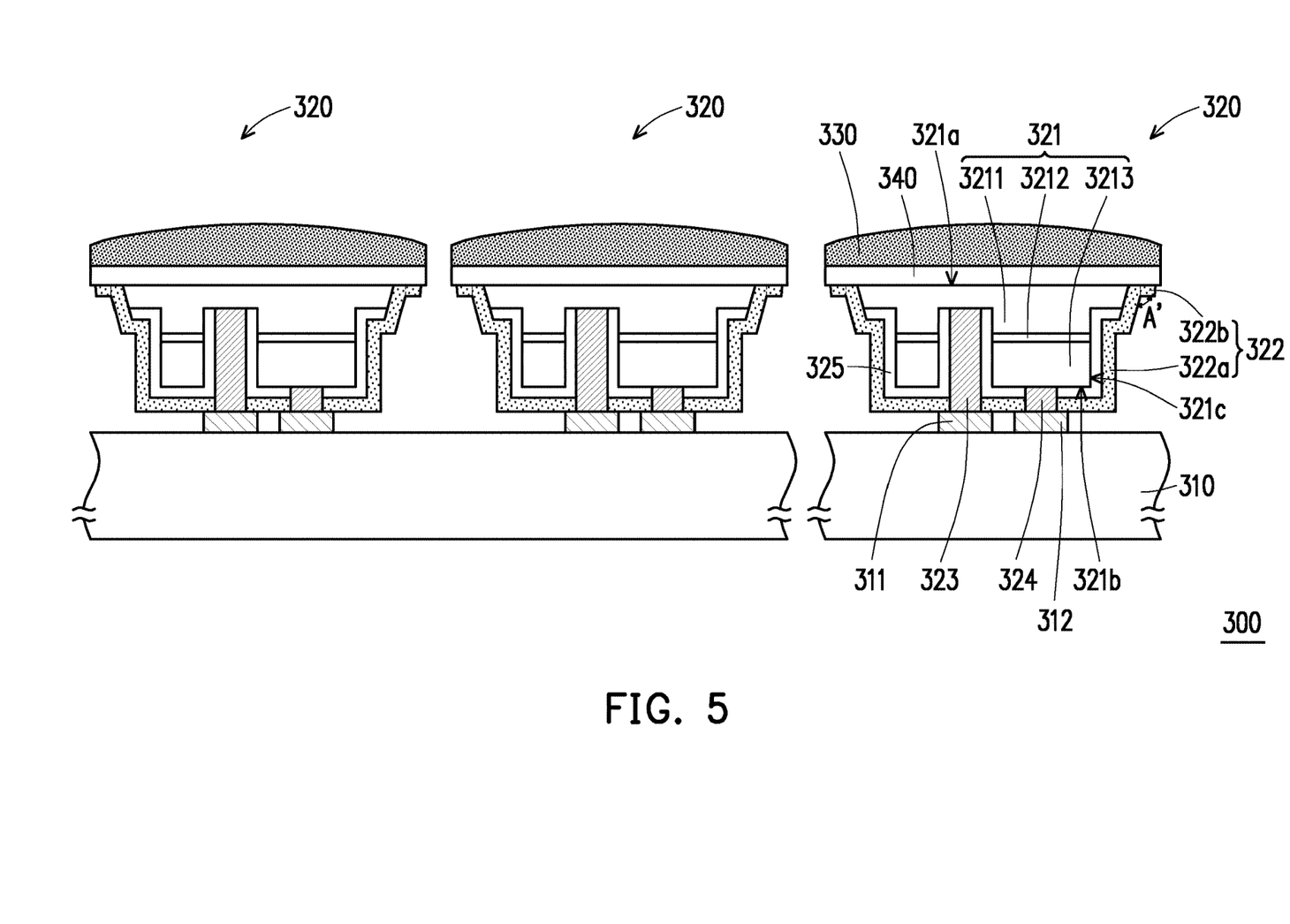
FIG. 5 is a schematic cross-sectional view showing a display apparatus according to an embodiment of the disclosure.

FIG. 5 is a schematic cross-sectional view showing a display apparatus according to an embodiment of the disclosure. Referring to FIG. 4 and FIG. 5, a micro device 320 of a display apparatus 300 of the present embodiment is similar to the micro device 320 of FIG. 4, and the difference between the two is that the display apparatus 300 of the embodiment includes a circuit substrate 310 and a plurality of micro devices 320 (three are schematically shown in FIG. 5).

Specifically, the circuit substrate 310 includes a plurality of first pads 311 (three are schematically shown in FIG. 5) and a plurality of second pads 312 (three are schematically shown in FIG. 5). The first pads 311 and the second pads 312 are respectively disposed on the circuit substrate 310. The micro device 320 is disposed on the circuit substrate 310 and is correspondingly electrically connected to the first pad 311 and the second pad 312. Herein, the circuit substrate 310 is, for example, a Complementary Metal-Oxide-Semiconductor (CMOS) substrate, a Liquid Crystal on Silicon (LCOS) substrate, a Thin Film Transistor (TFT) substrate, or other substrates with working circuits, but the disclosure is not limited thereto.

In the present embodiment, in a process of transferring and bonding the micro device 320 to the circuit substrate 310, the break point of the holding structure will be located in the predetermined fracture region, so it may prevent the sacrificial portion of the holding structure from remaining on the peripheral surface 321c of the transferred micro device 320. Thereby, the display apparatus 300 using the micro device 320 of the present disclosure may have a better reliability and a better light-emitting effect. The micro device 320 may respectively emit the red light, green light, and blue light, such that the display image may also be produced.

In summary, in the structure with micro device of the present disclosure, the overcoat layer of the structure with micro device has an extension portion contacting the sacrificial portion of the holding structure, wherein the extension portion extends in the direction away from the peripheral surface of the micro device, and a portion of the sacrificial portion contacts the extension portion to define the predetermined fracture region. Therefore, when the structure with micro device is transferred subsequently, the break point of the holding structure will be located in the predetermined fracture region, thereby preventing the sacrificial portion of the holding structure from remaining on the peripheral surface of the transferred micro device. In this manner, the light-emitting efficiency of the micro device of the present disclosure can be improved.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:
1. A micro device, comprising:
an epitaxial structure, having a top surface and a bottom surface opposite to each other and a peripheral surface connecting the top surface and the bottom surface;

an insulating layer, covering at least the bottom surface and part of the peripheral surface of the epitaxial structure;

an overcoat layer, comprising a contact portion and an extension portion, wherein the contact portion conformally covers the insulating layer and the peripheral surface and the bottom surface of the epitaxial structure, and the extension portion connects the contact portion and extends in a direction away from the peripheral surface;

a first light-guiding structure, disposed on the top surface of the epitaxial structure and the extension portion of the overcoat layer, wherein an orthogonal projection area of the first light-guiding structure on a horizontal plane is larger than an orthogonal projection area of the overcoat layer on the horizontal plane, and the orthogonal projection area of the overcoat layer on the horizontal plane is larger than an orthogonal projection area of the epitaxial structure on the horizontal plane; and a second light-guiding structure, disposed on the first light-guiding structure, and the first light-guiding structure disposed between the epitaxial structure and the second light-guiding structure, wherein a first surface area of the first light-guiding structure is larger than a second surface area of the second light-guiding structure in a top view of the micro device, wherein the epitaxial structure comprises a first type semiconductor layer, a light emitting layer, and a second type semiconductor layer, the light emitting layer is disposed between the first type semiconductor layer and the second type semiconductor layer, wherein a roughness of a first contact surface of the first light-guiding structure in a central region facing a side of the epitaxial structure and the first type semiconductor layer is greater than a roughness of a second contact surface of the first light-guiding structure in a periphery region surrounding the central region and the extension portion of the overcoat layer.

2. The micro device according to claim 1, wherein there is an included angle A' between the extension portion and the contact portion, and the included angle A' is between 90 degrees and 150 degrees.

3. The micro device according to claim 1, wherein the epitaxial structure comprises a first type semiconductor layer, a light emitting layer, and a second type semiconductor layer, the light emitting layer is disposed between the first type semiconductor layer and the second type semiconductor layer, the first type semiconductor layer has the top surface, the insulating layer covers the second type semiconductor layer, the light emitting layer and part of the first type semiconductor layer.

4. The micro device according to claim 1, wherein the insulating layer is transparent, and the overcoat layer is a reflective layer.

5. The micro device according to claim 1, wherein the first light-guiding structure has a first thickness, and the second light-guiding structure has a second thickness, and the second thickness is larger than the first thickness.

6. The micro device according to claim 5, wherein a thickness of a middle of the second light-guiding structure is greater than a thickness of an edge of the second light-guiding structure.

7. The micro device according to claim 1, wherein the first type semiconductor layer has the top surface, and an area of the first light-guiding structure is larger than an area of the top surface, and a ratio of the area of the top surface to the area of the first light-guiding structure is larger than or equal to 0.5 and smaller than or equal to 0.95.

8. The micro device according to claim 1, wherein the roughness of the first contact surface of the first light-guiding structure and the first type semiconductor layer is greater than a roughness of a third contact surface of the first light-guiding structure and the second light-guiding structure.

9. The micro device according to claim 1, wherein there is a minimum horizontal distance between the overcoat layer and the peripheral surface of the epitaxial structure, and the minimum horizontal distance is larger than or equal to 1 micrometer.

10. The micro device according to claim 1, wherein a ratio of the orthogonal projection area of the overcoat layer on the horizontal plane to the orthogonal projection area of the first light-guiding structure on the horizontal plane is larger than or equal to 0.8 and smaller than or equal to 1.

11. The micro device according to claim 1, wherein a ratio of the orthogonal projection area of the epitaxial structure on the horizontal plane to the orthogonal projection area of the overcoat layer on the horizontal plane is larger than or equal to 0.5 and smaller than or equal to 0.95.

12. The micro device according to claim 1, wherein a surface of the extension portion of the overcoat layer is aligned with the top surface of the epitaxial structure.

13. A display apparatus, comprising:

a circuit substrate, comprising a plurality of first pads and a plurality of second pads disposed on the circuit substrate; and a plurality of micro devices, disposed on the circuit substrate and correspondingly electrically connected to the first pads and the second pads, wherein each of the plurality of micro devices comprises:

an epitaxial structure, having a top surface and a bottom surface opposite to each other and a peripheral surface connecting the top surface and the bottom surface;

an insulating layer, covering at least the bottom surface and part of the peripheral surface of the epitaxial structure;

an overcoat layer, comprising a contact portion and an extension portion, wherein the contact portion conformally covers the insulating layer and the peripheral surface and the bottom surface of the epitaxial structure, and the extension portion connects the contact portion and extends in a direction away from the peripheral surface;

a first light-guiding structure, disposed on the top surface of the epitaxial structure and the extension portion of the overcoat layer, wherein an orthogonal projection area of the first light-guiding structure on a horizontal plane is larger than an orthogonal projection area of the overcoat layer on the horizontal plane, and the orthogonal projection area of the overcoat layer on the horizontal plane is larger than an orthogonal projection area of the epitaxial structure on the horizontal plane; and a second light-guiding structure, disposed on the first light-guiding structure, and the first light-guiding structure disposed between the epitaxial structure and the second light-guiding structure, wherein a first surface area of the first light-guiding structure is larger than a second surface area of the second light-guiding structure in a top view of the micro device, wherein the epitaxial structure comprises a first type semiconductor layer, a light emitting layer, and a second type semiconductor layer, the light emitting layer is disposed between the first type semiconductor layer and the second type semiconductor layer, wherein a roughness of a first contact surface of the first light-guiding structure in a central region facing a side of the epitaxial structure and the first type semiconductor layer is greater than a roughness of a second contact surface of the first light-guiding structure in a periphery region surrounding the central region and the extension portion of the overcoat layer.

* * * * *